US012701902B2

(12) United States Patent
Won et al.

(10) Patent No.: US 12,701,902 B2
(45) Date of Patent: Aug. 4, 2026

(54) DISPLAY APPARATUS HAVING AN AUXILIARY ELECTRODE

(71) Applicant: LG Display Co., Ltd., Seoul (KR)

(72) Inventors: Sang Hyuk Won, Paju-si (KR); Seon Hee Lee, Paju-si (KR); Sung Woo Choi, Paju-si (KR); Young Kyun Moon, Paju-si (KR); Dong Il Chu, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 435 days.

(21) Appl. No.: 18/389,504

(22) Filed: Nov. 14, 2023

(65) Prior Publication Data

US 2024/0215384 A1      Jun. 27, 2024

(30) Foreign Application Priority Data

Dec. 27, 2022    (KR) ........................ 10-2022-0185448

(51) Int. Cl.
  H10K 59/80        (2023.01)
  H10K 59/122       (2023.01)
(52) U.S. Cl.
  CPC ..... H10K 59/80522 (2023.02); H10K 59/122 (2023.02)
(58) Field of Classification Search
  CPC ........... H10K 59/80522; H10K 59/122; H10K 59/124; H10K 59/131; H10K 59/121; H10K 59/805; H10K 59/8051; H10K 50/824; H10K 50/11; G09F 9/335
  See application file for complete search history.

(56) References Cited

U.S. PATENT DOCUMENTS

2016/0293888 A1    10/2016  Shim et al.
2024/0122032 A1*    4/2024  Wang .............. H10K 59/80517

FOREIGN PATENT DOCUMENTS

KR          10-0936881 B1      1/2010
KR      10-2016-0119301 A     10/2016
KR      10-2019-0122455 A     10/2019

* cited by examiner

*Primary Examiner* — Anne M Hines
*Assistant Examiner* — Jose M Diaz
(74) *Attorney, Agent, or Firm* — Birch, Stewart, Kolasch & Birch, LLP

(57)            ABSTRACT

A display apparatus can include pixel areas and a contact area between the pixel areas. An auxiliary electrode can be disposed in the contact area. Each of the pixel areas can include a light-emitting device on a device substrate. An insulating layer including at least one contact hole overlapping with the contact area can be disposed on the device substrate. A connection electrode electrically connected to the auxiliary electrode can extend along a sidewall and a bottom surface of the contact hole. A light-emitting layer and a second electrode of the light-emitting device in each pixel area can extend inside of the contact hole. Thus, in the display apparatus, a process of forming the second electrode and the connection electrode can be simplified, and damage of the light-emitting device due to a process of connecting the second electrode and the connection electrode can be minimized.

16 Claims, 7 Drawing Sheets

DISPLAY APPARATUS HAVING AN AUXILIARY ELECTRODE

CROSS-REFERENCE TO RELATED APPLICATIONS

This application claims priority to Korean Patent Application No. 10-2022-0185448, filed on Dec. 27, 2022 in the Republic of Korea, the entire contents of which are hereby expressly incorporated by reference into the present application.

BACKGROUND

Technical Field

The present disclosure relates to a display apparatus capable of preventing a luminance deviation due to a voltage drop using an auxiliary electrode.

Discussion of the Related Art

Generally, a display apparatus provides an image to a user. For example, the display apparatus can include a plurality of pixel areas. Each of the pixel areas can realize a specific color. A light-emitting device can be disposed in each pixel area. The light-emitting device can emit light displaying a specific color. The light-emitting device can have a stacked structure of a first electrode, a light-emitting layer and a second electrode.

An auxiliary electrode can be disposed between the pixel areas. The auxiliary electrode can prevent a luminance deviation due to a voltage drop. For example, the second electrode of each light-emitting device can be electrically connected to the auxiliary electrode. A process of connecting the second electrode of each light-emitting device to the auxiliary electrode can include a process of irradiating a laser. For instance, a process of forming the display apparatus can include a process of removing the light-emitting layer formed on the auxiliary electrode using a laser.

However, in the display apparatus, the light-emitting device can be damaged due to heat generated by the irradiation of the laser or particle. And, when the irradiation time of the laser is reduced, the electrical connection between the second electrode and the auxiliary electrode in the display apparatus can become unstable due to the residual of the light-emitting layer.

SUMMARY OF THE DISCLOSURE

Accordingly, the present disclosure is directed to a display apparatus that substantially obviates one or more problems due to limitations and disadvantages of the related art.

An object of the present disclosure is to provide a display apparatus capable of preventing the damage of the light-emitting devices due to a process of connecting a second electrode of each light-emitting device and an auxiliary electrode.

Another object of the present disclosure is to provide a display apparatus capable of minimizing the irradiation time of a laser for electrical connection of a second electrode of each light-emitting device and an auxiliary electrode.

Additional advantages, objects, and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these objects and other advantages and in accordance with the purpose of the present disclosure, as embodied and broadly described herein, there is provided a display apparatus comprising a device substrate. The device substrate includes an emission area and a contact area. An auxiliary electrode and a first insulating layer are disposed on the device substrate. The auxiliary electrode is disposed on the contact area of the device substrate. The first insulating layer includes at least one first contact hole. The first contact hole overlaps the contact area. The auxiliary electrode is electrically connected to a connection electrode. The connection electrode extends along a sidewall and a bottom surface of the first contact hole. A bank insulating layer is disposed on the first insulating layer. The bank insulating layer includes a first opening and a second opening. The first opening overlaps the emission area. The second opening exposes at least portion of the connection electrode. A light-emitting device is disposed on the first insulating layer exposed by the first opening. The light-emitting device has a stacked structure of a first electrode, a light-emitting layer and a second electrode. The light-emitting layer and the second electrode of the light-emitting device extend inside of the first contact hole through the second opening. The sidewall of the first contact hole has an inclination angle larger than that of a sidewall of the second opening. The second electrode is in contact with the connection electrode on the sidewall of the first contact hole.

The sidewall of the second opening can have an inclination angle that is same as a sidewall of the first opening.

The first contact hole can overlap a portion of the auxiliary electrode. The connection electrode can be in contact with the auxiliary electrode in the first contact hole.

A width of the auxiliary electrode can be smaller than a width of the contact area.

A second insulating layer can be disposed between the device substrate and the first insulating layer. The second insulating layer can include at least one second contact hole. The second contact hole can overlap the contact area. The connection electrode, the light-emitting layer and the second electrode can extend inside of the second contact hole. A sidewall of the second contact hole can have an inclination angle larger than that of the sidewall of the first contact hole.

The second electrode can be in contact with the connection electrode on the sidewall of the second contact hole.

The second contact hole can be disposed outside the auxiliary electrode.

The second contact hole can overlap the first contact hole.

The second insulating layer can include a material different from the first insulating layer.

The first insulating layer can include an organic insulating material. The second insulating layer can include an inorganic insulating material.

In another embodiment, there is provided a display apparatus comprising a device substrate. An interlayer insulating layer is disposed on the device substrate. The interlayer insulating layer includes at least one lower contact hole. An auxiliary electrode and an upper planarization layer are disposed on the interlayer insulating layer. The auxiliary electrode is spaced apart from the lower contact hole. The upper planarization layer includes an upper contact hole. The upper contact hole overlaps a portion of the auxiliary electrode and the lower contact hole. An upper connection electrode is electrically connected to the auxiliary electrode in the upper contact hole. The upper connection electrode extends along a sidewall and a bottom surface of the upper contact hole. A first electrode and a bank insulating layer are disposed on the upper planarization layer. The first electrode is spaced apart from the upper connection electrode. The bank insulating layer includes a first opening and a second opening. The first opening exposes a portion of the first electrode. The second opening overlaps the upper contact hole. A light-emitting layer is disposed on the portion of the first electrode exposed by the first opening. The light-emitting layer extends inside of the lower contact hole through the upper contact hole. A second electrode is disposed on the light-emitting layer. The second electrode overlaps the first electrode and the upper connection electrode. The sidewall of the lower contact hole has an inclination angle larger than that of a sidewall of the second opening. The light-emitting layer exposes at least portion of the upper connection electrode on the sidewall of the lower contact hole. The second electrode is electrically connected to a portion of the upper connection electrode exposed by the light-emitting layer.

A sidewall of the upper contact hole can have an inclination angle larger than that of the sidewall of the second opening.

A lower planarization layer can be disposed between the interlayer insulating layer and the upper planarization layer. The lower planarization layer can include an intermediate contact hole. The intermediate contact hole can overlap a portion of the auxiliary electrode and the lower contact hole in the upper contact hole. The upper connection electrode can be electrically connected to a lower connection electrode. The lower connection electrode can be in contact with the auxiliary electrode in the intermediate contact hole.

A sidewall of the intermediate contact hole can have an inclination angle larger than that of the sidewall of the second opening.

The upper connection electrode can include a same material as the first electrode.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings:

FIG. 2 is a view showing a circuit of a unit pixel area in the display apparatus according to the embodiment of the present disclosure;

FIG. 3 is a view taken along line I-I' of FIG. 1;

FIG. 4 is an enlarged view of K1 region in FIG. 3; and

FIGS. 5 to 12 are views showing a display apparatus according to one or more other embodiments of the present disclosure.

DETAILED DESCRIPTION OF THE EMBODIMENTS

Figure 1:
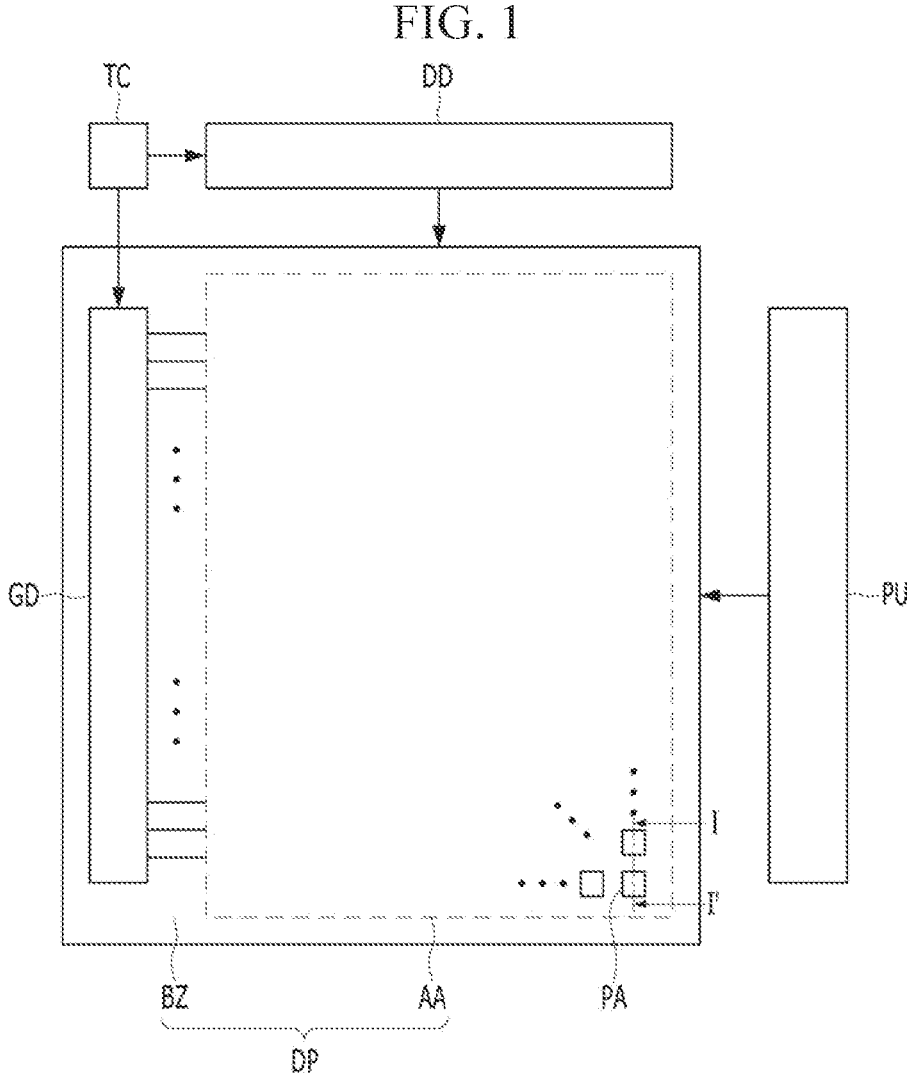
FIG. 1 is a view schematically showing a display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure can be embodied in other forms and is not limited to the embodiments described below.

In addition, the same or extremely similar elements can be designated by the same reference numerals throughout the specification and in the drawings, the lengths and thickness of layers and regions can be exaggerated for convenience. It will be understood that, when a first element is referred to as being "on" a second element, although the first element can be disposed on the second element so as to come into contact with the second element, a third element can be interposed between the first element and the second element.

Here, terms such as, for example, "first" and "second" can be used to distinguish any one element with another element, and may not define order or sequence. However, the first element and the second element can be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

And, unless 'directly' is used, the terms "connected" and "coupled" can include that two components are "connected" or "coupled" through one or more other components located between the two components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figures 2, 3:
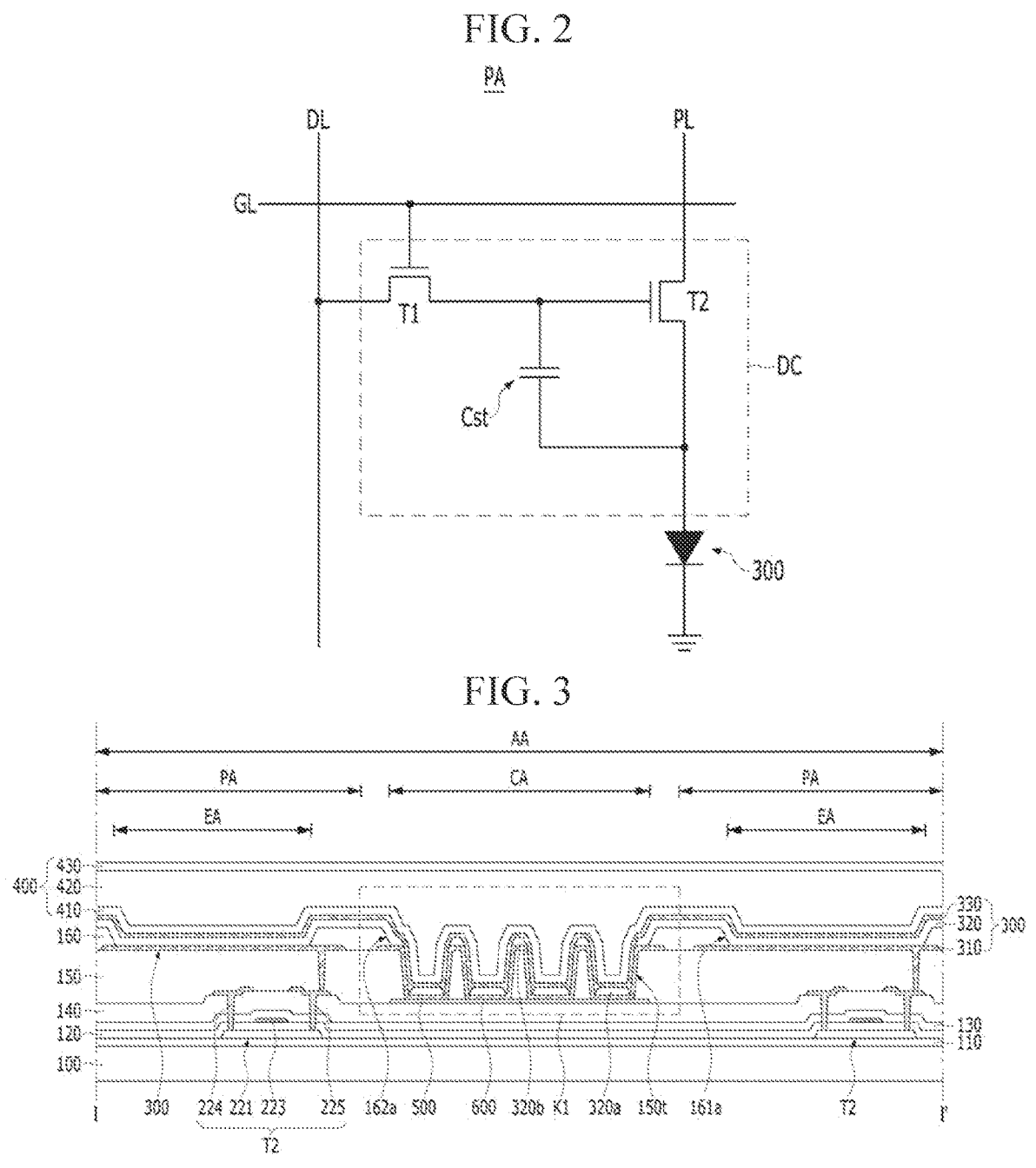
Figures 4, 5:
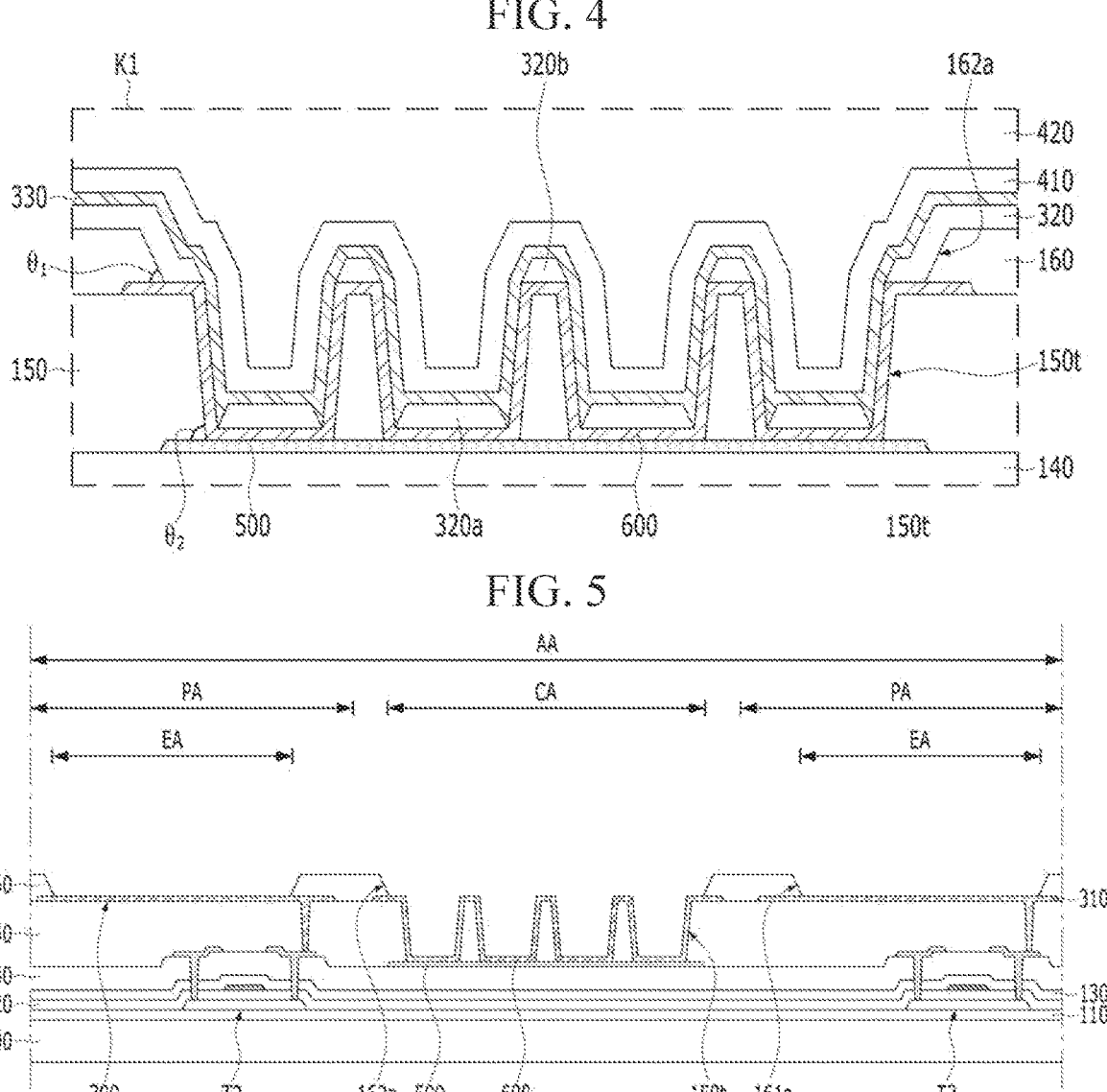

FIG. 1 is a view schematically showing a display apparatus according to an embodiment of the present disclosure. FIG. 2 is a view showing a circuit of a unit pixel area in the display apparatus according to the embodiment of the present disclosure. FIG. 3 is a view taken along line I-I' of FIG. 1. FIG. 4 is an enlarged view of K1 region in FIG. 3.

Referring to FIGS. 1 to 4, the display apparatus according to the embodiment of the present disclosure can include a display panel DP. The display panel DP can generate an image provided to a user. For example, the display panel DP can include a plurality of pixel areas PA.

Various signals can be provided to each pixel area PA through signal wirings GL, DL and PL. For example, the signal wirings (or lines) GL, DL and PL can include gate lines GL applying a gate signal to each pixel area PA, data lines DL applying a data signal to each pixel area PA, and power voltage supply lines PL supplying a positive power voltage VDD to each pixel area PA. For example, the gate lines GL can be electrically connected to a gate driver GD. The data lines DL can be electrically connected to a data driver DD. The power voltage supply lines PL can be electrically connected to a power unit PU.

The gate driver GD and the data driver DD can be controlled by a timing controller TC. For example, the gate driver GD can receive clock signals, reset signals and a start signal from the timing controller TC, and the data driver DD can receive digital video data and a source timing signal from the timing controller TC.

The display panel DP can include a display area (active area) AA in which the pixel areas PA are disposed, and a bezel area BZ disposed outside the display area AA. At least one of the gate driver GD, the data driver DD, the power unit PU and the timing controller TC can be disposed on the bezel area BZ of the display panel DP. For example, the display apparatus according to the embodiment of the present disclosure can be a Gate In Panel (GIP) type display apparatus in which the gate driver GD is formed on the bezel area BZ of the display panel DP.

Each of the pixel areas PA can realize a specific color. For example, a light-emitting device 300 and a pixel driving circuit DC electrically connected to the light-emitting device 300 can be disposed in each pixel area PA. The light-emitting device 300 and the pixel driving circuit DC of each pixel area PA can be disposed on a device substrate 100. The device substrate 100 can include an insulating material. For example, the device substrate 100 can include glass or plastic.

The light-emitting device 300 can emit light displaying a specific color. For example, the light-emitting device 300 can include a first electrode 310, a light-emitting layer 320 and a second electrode 330, which are sequentially stacked on the device substrate 100.

The first electrode 310 can include a conductive material. The first electrode 310 can include a material having a high reflectance. For example, the first electrode 310 can include a metal, such as aluminum (Al) and silver (Ag). The first electrode 310 can have a multi-layer structure. For example, the first electrode 310 can have a structure in which a reflective electrode made of a metal is disposed between transparent electrodes made of a transparent conductive material, such as ITO and IZO.

The light-emitting layer 320 can generate light having luminance corresponding to a voltage difference between the first electrode 310 and the second electrode 330. For example, the light-emitting layer 320 can include an emission material layer (EML) having an emission material. The emission material can include an organic material, an inorganic material or a hybrid material. For example, the display apparatus according to the embodiment of the present disclosure can be an organic light-emitting display apparatus including an organic emission material.

The light-emitting layer 320 can have a multi-layer structure. For example, the light-emitting layer 320 can further include at least one of a hole injection layer (HIL), a hole transport layer (HTL), an electron transport layer (ETL) and an electron injection layer (EIL). Thus, in the display apparatus according to the embodiment of the present disclosure, the emission efficiency of the light-emitting layer 320 can be improved.

The second electrode 330 can include a conductive material. The second electrode 330 can include a material different from the first electrode 310. A transmittance of the second electrode 330 can be higher than a transmittance of the first electrode 310. For example, the second electrode 330 can be a transparent electrode made of a transparent conductive material, such as ITO and IZO. Thus, in the display apparatus according to the embodiment of the present disclosure, the light generated by the light-emitting layer 320 can be emitted outside through the second electrode 330.

The pixel driving circuit DC can supply a driving current corresponding to the data signal to the light-emitting device 300 according to gate signal for one frame. For example, the pixel driving circuit DC can include a first thin film transistor T1, a second thin film transistor T2 and a storage capacitor Cst.

The first thin film transistor T1 can transmit the data signal to the second thin film transistor T2 according to the gate signal. For example, the first thin film transistor T1 can be a switching thin film transistor. The first thin film transistor T1 can include a first semiconductor pattern, a first gate electrode, a first source electrode and a first drain electrode. For example, the first gate electrode of the first thin film transistor T1 can be electrically connected to the gate line GL, and the first drain electrode of the first thin film transistor T1 can be electrically connected to the date line DL.

The first semiconductor pattern can include a semiconductor material. For example, the first semiconductor pattern can include amorphous silicon (a-Si), polycrystalline silicon (Poly-Si) or an oxide semiconductor, such as IGZO. The first semiconductor pattern can include a first drain region, a first channel region and a first source region. The first channel region can be disposed between the first drain region and the first source region. A resistance of the first drain region and a resistance of the first source region can be lower than a resistance of the first channel region. For example, the first drain region and the first source region can include a conductive region of an oxide semiconductor. The first channel region can be a region of an oxide semiconductor, which is not conductorized.

The first gate electrode can include a conductive material. For example, the first gate electrode can include a metal, such as aluminum (Al), chrome (Cr), copper (Cu), molybdenum (Mo), titanium (Ti) and tungsten (W). The first gate electrode can be disposed on the first semiconductor pattern. For example, the first gate electrode can overlap the first channel region of the first semiconductor pattern. The first drain region and the first source region of the first semiconductor pattern can be disposed outside the first gate electrode. The first gate electrode can be insulated from the first semiconductor pattern. For example, the first source region can be electrically connected to the first drain region by the gate signal.

The first drain electrode can include a conductive material. For example, the first drain electrode can include a metal, such as aluminum (Al), chrome (Cr), copper (Cu), molybdenum (Mo), titanium (Ti) and tungsten (W). The first drain electrode can include a material different from the first gate electrode. The first drain electrode can be disposed on a layer different from the first gate electrode. The first drain electrode can be electrically connected to the first drain region of the first semiconductor pattern. For example, the first drain electrode can be insulated from the first gate electrode.

The first source electrode can include a conductive material. For example, the first source electrode can include a metal, such as aluminum (Al), chrome (Cr), copper (Cu), molybdenum (Mo), titanium (Ti) and tungsten (W). The first source electrode can include a material different from the first gate electrode. The first source electrode can be disposed on a layer different from the first gate electrode. For example, the first source electrode can be disposed on a same layer as the first drain electrode. The first source electrode can include a same material as the first drain electrode. For example, the first source electrode can be formed simultaneously with the first drain electrode. The first source electrode can be electrically connected to the first source region of the first semiconductor pattern. For example, the first source electrode can be insulated from the first gate electrode.

The second thin film transistor T2 can generate the driving current corresponding to the data signal. For example, the second thin film transistor T2 can be a driving thin film transistor. The second thin film transistor T2 can include a second semiconductor pattern 221, a second gate electrode 223, a second drain electrode 225 and a second source electrode 227. For example, the second gate electrode 223 can be electrically connected to the first source electrode of the first thin film transistor T1, and the second drain electrode 225 can be electrically connected to the power voltage supply line PL. The light-emitting device 300 can be electrically connected to the second thin film transistor T2. For example, the second source electrode 227 can be electrically connected to the first electrode 310 of the light-emitting device 300. The second thin film transistor T2 can have a same structure as the first thin film transistor T1.

The second semiconductor pattern 221 can include a semiconductor material. For example, the second semiconductor pattern 221 can include amorphous silicon (a-Si), polycrystalline silicon (Poly-Si) or an oxide semiconductor, such as IGZO. The second semiconductor pattern 221 can include a second channel region between a second drain region and a second source region. The second drain region and the second source region can have a resistance lower than the second channel region. For example, the second drain region and the second source region can include a conductive region of an oxide semiconductor. The second channel region can be a region of an oxide semiconductor, which is not conductorized.

The second semiconductor pattern 221 can include a same material as the first semiconductor pattern. For example, the second semiconductor pattern 221 can be formed simultaneously with the first semiconductor pattern. The second semiconductor pattern 221 can be disposed on a same layer as the first semiconductor pattern. The second drain region and the second source region of the second semiconductor pattern 221 can have a same resistance as the first drain region and the first source region of the first semiconductor pattern. For example, the second channel region of the second semiconductor pattern 221 can have a same resistance as the first channel region of the first semiconductor pattern.

The second gate electrode 223 can include a conductive material. For example, the second gate electrode 223 can include a metal, such as aluminum (Al), chrome (Cr), copper (Cu), molybdenum (Mo), titanium (Ti) and tungsten (W). The second gate electrode 223 can include a same material as the first gate electrode. For example, the second gate electrode 223 can be formed simultaneously with the first gate electrode. The second gate electrode 223 can be disposed on a same layer as the first gate electrode.

The second gate electrode 223 can be disposed on the second semiconductor pattern 221. For example, the second gate electrode 223 can overlap the second channel region of the second semiconductor pattern 221. The second drain region and the second source region of the second semiconductor pattern 221 can be disposed outside the second gate electrode 223. The second gate electrode 223 can be insulated from the second semiconductor pattern 221. For example, the second channel region of the second semiconductor pattern 221 can have an electrical conductivity corresponding to a voltage applied to the second gate electrode 223.

The second drain electrode 225 can include a conductive material. For example, the second drain electrode 225 can include a metal, such as aluminum (Al), chrome (Cr), copper (Cu), molybdenum (Mo), titanium (Ti) and tungsten (W). The second drain electrode 225 can include a material different from the second gate electrode 223. The second drain electrode 225 can be disposed on a layer different from the second gate electrode 223. For example, the second drain electrode 225 can be insulated from the second gate electrode 223. The second drain electrode 225 can be electrically connected to the second drain region of the second semiconductor pattern 221.

The second drain electrode 225 can include a same material as the first drain electrode. The second drain electrode 225 can be disposed on a same layer as the first drain electrode. For example, the second drain electrode 225 can be formed simultaneously with the first drain electrode. Thus, in the display apparatus according to the embodiment of the present disclosure, process efficiency can be improved.

The second source electrode 227 can include a conductive material. For example, the second source electrode 227 can include a metal, such as aluminum (Al), chrome (Cr), copper (Cu), molybdenum (Mo), titanium (Ti) and tungsten (W). The second source electrode 227 can include a material different from the second gate electrode 223. The second source electrode 227 can be disposed on a layer different from the second gate electrode 223. For example, the second source electrode 227 can be insulated from the second gate electrode 223. The second source electrode 227 can be electrically connected to the second source region of the second semiconductor pattern 221.

The second source electrode 227 can be disposed on a same layer as the first source electrode. The second source electrode 227 can include a same material as the first source electrode. For example, the second source electrode 227 can be formed simultaneously with the first source electrode. Thus, in the display apparatus according to the embodiment of the present disclosure, process efficiency can be improved.

The storage capacitor Cst can maintain a signal applied to the second gate electrode 223 of the second thin film transistor T2 for one frame. For example, the storage capacitor Cst can be electrically connected between the second gate electrode 223 and the second source electrode 227 of the second thin film transistor T2. The storage capacitor Cst can have a stacked structure of capacitor electrodes. The storage capacitor Cst can be formed using a process of forming the first thin film transistor T1 and the second thin film transistor T2. For example, the storage capacitor Cst can include a first capacitor electrode disposed on a same layer as the second gate electrode 223 and a second capacitor electrode disposed on a same layer as the second source electrode 227.

A plurality of insulating layers 110, 120, 130, 140, 150 and 160 for preventing unnecessary electrical connection in each pixel area PA can be disposed on the device substrate 100. For example, a device buffer layer 110, a gate insulating layer 120, a first interlayer insulating layer 130, a second interlayer insulating layer 140, a planarization layer 150 and a bank insulating layer 160 can be disposed on the device substrate 100.

The device buffer layer 110 can be disposed close to the device substrate 100. The device buffer layer 110 can prevent pollution due to the device substrate 100 in a process of forming the pixel driving circuit DC of each pixel area PA. For example, the device buffer layer 110 can completely cover the display area AA and the bezel area BZ of the device substrate 100. The pixel driving circuit DC of each pixel area PA can be disposed on the device buffer layer 110. The device buffer layer 110 can include an insulating material. For example, the device buffer layer 110 can include an inorganic insulating material, such as silicon oxide (SiOx) and silicon nitride (SiNx). The device buffer layer 110 can include a multi-layer structure. For example, the device buffer layer 110 can have a stacked structure of an inorganic insulating layer made of silicon oxide (SiOx) and an inorganic insulating layer made of silicon nitride (SiNx).

The gate insulating layer 120 can insulate the gate electrodes 223 of each pixel area PA from the corresponding semiconductor pattern 221. For example, the first semiconductor pattern and the second semiconductor pattern 221 of each pixel area PA can be covered by the gate insulating layer 120. The first gate electrode and the second gate electrode 223 of each pixel area PA can be disposed on the gate insulating layer 120. The gate insulating layer 120 can include an insulating material. For example, the gate insulating layer 120 can include an inorganic insulating material, such as silicon oxide (SiOx).

The first interlayer insulating layer 130 and the second interlayer insulating layer 140 can insulate the drain electrodes 225 and the source electrode 227 of each pixel area PA from the corresponding gate electrode 223. The second interlayer insulating layer 140 can be disposed on the first interlayer insulating layer 130. For example, the first gate electrode and the second gate electrode 223 of each pixel area PA can be covered by the first interlayer insulating layer 130. The first drain electrode, the first source electrode, the second drain electrode 225 and the second source electrode 227 of each pixel area PA can be disposed on the second interlayer insulating layer 140.

The first interlayer insulating layer 130 and the second interlayer insulating layer 140 can include an insulating material. For example, the first interlayer insulating layer 130 and the second interlayer insulating layer 140 can be an inorganic insulating material such as silicon oxide (SiOx) and silicon nitride (SiNx). The second interlayer insulating layer 140 can include a material different from the first interlayer insulating layers 130. For example, the first interlayer insulating layer 130 can be an inorganic insulating layer made of silicon oxide (SiOx), and the second interlayer insulating layer 140 can be an inorganic insulating layer made of silicon nitride (SiNx).

The planarization layer 150 can be disposed on the second interlayer insulating layer 140. For example, the first drain electrode, the first source electrode, the second drain electrode 225 and the second source electrode 227 of each pixel area PA can be covered by the planarization layer 150. The planarization layer 150 can remove a thickness difference due to the pixel driving circuit DC of each pixel area PA. For example, an upper surface of the planarization layer 150 opposite to the device substrate 100 can be a flat surface. The planarization layer 150 can include an insulating material. The planarization layer 150 can include a material different from the second interlayer insulating layer 140. For example, the planarization layer 150 can include an organic insulating material.

The light-emitting device 300 of each pixel area PA can be disposed on the planarization layer 150. For example, the first electrode 310, the light-emitting layer 320 and the second electrode 330 of each pixel area PA can be sequentially stacked on the planarization layer 150 in the corresponding pixel area PA. The first electrode 310 of each pixel area PA can be in direct contact with the upper surface of the planarization layer 150. Thus, in the display apparatus according to the embodiment of the present disclosure, luminance deviation according to generating location of light emitted from each light-emitting device 300 can be prevented.

The bank insulating layer 160 can be disposed on the planarization layer 150. The bank insulating layer 160 can define an emission area EA in each pixel area PA. For example, the bank insulating layer 160 can include first openings 161a overlapping with a portion of the first electrode 310 in each pixel area PA. An edge of the first electrode 310 in each pixel area PA can be disposed outside the corresponding first opening 161a. For example, an edge of the first electrode 310 in each pixel area PA can be covered by the bank insulating layer 160. The light-emitting layer 320 and the second electrode 330 of each pixel area PA can be sequentially stacked on the portion of the corresponding first electrode 310 exposed by the corresponding first opening 161a. The bank insulating layer 160 can include an insulating material. For example, the bank insulating layer 160 can be an organic insulating material. The bank insulating layer 160 can include a material different from the planarization layer 150.

At least part of the light-emitting layer 320 in each pixel area PA can extend onto the bank insulating layer 160. For example, at least one of the hole injection layer (HIL), the hole transport layer (HTL), the electron transport layer (ETL) and the electron injection layer (EIL) of the light-emitting layer 320 in each pixel area PA can be in direct contact with the corresponding layer of the light-emitting layer 320 in adjacent pixel area PA. At least one of the hole injection layer (HIL), the hole transport layer (HTL), the electron transport layer (ETL) and the electron injection layer (EIL) of the light-emitting layer 320 in each pixel area PA can include a same material as the corresponding layer of the light-emitting layer 320 in adjacent pixel area PA. At least one of the hole injection layer (HIL), the hole transport layer (HTL), the electron transport layer (ETL) and the electron injection layer (EIL) of the light-emitting layer 320 in each pixel area PA can be formed simultaneously with the corresponding layer of the light-emitting layer 320 in adjacent pixel area PA. For example, at least one of the hole injection layer (HIL), the hole transport layer (HTL), the electron transport layer (ETL) and the electron injection layer (EIL) can be formed on an entire surface of the display area AA. Thus, in the display apparatus according to the embodiment of the present disclosure, process efficiency can be improved.

A voltage applied to the second electrode 330 of each pixel area PA can be a same as a voltage applied to the second electrode 330 of adjacent pixel area PA. For example, a negative power voltage can be applied to the second electrode 330 of each pixel area PA. The second electrode 330 of each pixel area PA can be electrically connected to the second electrode 330 of adjacent pixel area PA. The second electrode 330 of each pixel area PA can include a same material as the second electrode 330 of adjacent pixel area PA. For example, the second electrode 330 of each pixel area PA can be formed simultaneously with the second electrode 330 of adjacent pixel area PA. The second electrode 330 of each pixel area PA can be in direct contact with the second electrode 330 of adjacent pixel area PA. For example, the second electrode 330 of each pixel area PA can extend onto the bank insulating layer 160. The bank insulating layer 160 can covered by the second electrode 330. Thus, in the display apparatus according to the embodiment of the present disclosure, a process of forming the second electrode 330 in each pixel area PA can be simplified. And, in the display apparatus according to the embodiment of the present disclosure, luminance of the light emitted from the light-emitting device 300 of each pixel area PA can be controlled by the data signal applied to the pixel driving circuit DC of the corresponding pixel area PA.

An encapsulation element 400 can be disposed on the light-emitting device 300 of each pixel area PA. The encapsulation element 400 can prevent damage of the light-emitting devices 300 due to the external moisture and impact. The encapsulation element 400 can have a multi-layer structure. For example, the encapsulation element 400 can include a first encapsulating layer 410, a second encapsulating layer 420 and a third encapsulating layer 430, which are sequentially stacked.

The first encapsulating layer 410, the second encapsulating layer 420 and the third encapsulating layer 430 can include an insulating material. The second encapsulating layer 420 can include a material different from the first encapsulating layer 410 and the third encapsulating layer 430. For example, the first encapsulating layer 410 and the third encapsulating layer 430 can be an inorganic insulating layer made of silicon oxide (SiOx) or silicon nitride (SiNx), and the second encapsulating layer 420 can be an organic insulating layer made of an organic insulating material. Thus, in the display apparatus according to the embodiment of the present disclosure, the damage of the light-emitting devices 300 due to the external moisture and impact can be effectively prevented.

The display area AA of the device substrate 100 can include a contact area CA between the pixel areas PA. An auxiliary electrode 500 can be disposed on the contact area CA of the device substrate 100. The pixel areas PA can be arranged side by side in a first direction and a second direction perpendicular to the first direction within the display area AA. The arrangement of the pixel areas PA can be in a matrix form. The auxiliary electrode 500 can extend between the pixel areas PA. For example, a plane of the auxiliary electrode 500 can have a mesh shape.

The auxiliary electrode 500 can include a conductive material. The auxiliary electrode 500 can include a material having a relative low resistance. For example, the auxiliary electrode 500 can include a metal, such as aluminum (Al), chrome (Cr), copper (Cu), molybdenum (Mo), titanium (Ti) and tungsten (W). The auxiliary electrode 500 can be formed using a process of forming the pixel driving circuit DC in each pixel area PA. A portion of the auxiliary electrode 500 extending in parallel to the data line DL can include a material different from a portion of the auxiliary electrode 500 extending in parallel to the gate line GL. For example, a portion of the auxiliary electrode 500 extending in parallel to the data line DL can include the same material as the second drain electrode 225 and the second source electrode 227 of each pixel area PA, and a portion of the auxiliary electrode 500 extending in parallel to the gate line GL can include the same material as the second gate electrode 223 of each pixel area PA. Thus, in the display apparatus according to the embodiment of the present disclosure, a process of forming the auxiliary electrode 500 can be simplified. Therefore, in the display apparatus according to the embodiment of the present disclosure, process efficiency can be improved.

The light-emitting layer 320 and the second electrode 330 of each light-emitting device 300 can include a region overlapping with the contact area CA of the device substrate 100. The bank insulating layer 160 can include a second opening 162a overlapping with the contact area CA. The planarization layer 150 can include a plurality of auxiliary contact holes 150t exposing a portion of the auxiliary electrode 500. For example, the light-emitting layer 320 and the second electrode 330 of each light-emitting device 300 can extend inside of the auxiliary contact holes 150t through the second opening 162a of the bank insulating layer 160.

A connection electrode 600 can be disposed on a sidewall and a bottom surface of each auxiliary contact hole 150t. For example, the connection electrode 600 can be in direct contact with the auxiliary electrode 500 in each auxiliary contact hole 150t. The connection electrode 600 can include a conductive material. The connection electrode 600 can include a material having a relative low resistance. For example, the connection electrode 600 can include a metal, such as aluminum (Al), chrome (Cr), copper (Cu), molybdenum (Mo), titanium (Ti) and tungsten (W). The connection electrode 600 can be electrically connected to the auxiliary electrode 500.

An end of the connection electrode 600 can be disposed between the planarization layer 150 and the bank insulating layer 160. For example, an end of the connection electrode 600 can be disposed on a same layer as the first electrode 310 of each pixel area PA. The connection electrode 600 can include a same material as the first electrode 310 of each pixel area PA. For example, the connection electrode 600 can be formed simultaneously with the first electrode 310 of each pixel area PA. The connection electrode 600 can be disposed only on the contact area CA. For example, the first electrode 310 of each pixel area PA can be spaced apart from the connection electrode 600.

The sidewall of each auxiliary contact hole 150t can have a relative large inclination angle θ2. For example, the inclination angle θ2 of the sidewall of each auxiliary contact hole 150t can be larger than an inclination angle θ1 of a sidewall of the second opening 162a. A thickness of the light-emitting layer 320 formed by a deposition process can be inversely proportional to the inclination angle of the target surface. For example, in the display apparatus according to the embodiment of the present disclosure, a portion of the light-emitting layer 320 on the sidewall of each auxiliary contact hole 150t can be formed to have a thinner thickness than a portion of the light-emitting layer 320 on the sidewall of the second opening 162a. The sidewall of each auxiliary contact hole 150t can have an inclination angle close to vertical. In other words, the difference between the inclination angle of the sidewall of each auxiliary contact hole 150t and a right angle is smaller than the difference between the inclination angle of the sidewall of the second opening 162a and a right angle. The inclination angle of the sidewall of each auxiliary contact hole 150t can be set according actual requirements. For example, the inclination angle θ2 of the sidewall of each auxiliary contact hole 150t can be 85° to 90°. Thus, in the display apparatus according to the embodiment of the present disclosure, at least part of the light-emitting layer 320 formed on the sidewall of each auxiliary contact hole 150t can be separated. For example, the light-emitting layer 320 on the contact area CA can include a first emission pattern 320a on the bottom surface of each auxiliary contact hole 150t and a second emission pattern 320b between the auxiliary contact holes 150t, wherein the second emission pattern 320b can be spaced apart from the first emission pattern 320a.

The second electrode 330 of each pixel area PA can be in direct contact with at least part of the connection electrode 600 exposed by the light-emitting layer 320 at the sidewall of each auxiliary contact hole 150*t*. For example, in the display apparatus according to the embodiment of the present disclosure, the second electrode 330 of each pixel area PA can be electrically connected to the auxiliary electrode 500 through the connection electrode 600. Thus, in the display apparatus according to the embodiment of the present disclosure, a process of connecting the second electrode 330 of each pixel area PA to auxiliary electrode 500 can be simplified. And, in the display apparatus according to the embodiment of the present disclosure, damage of the light-emitting devices 300 due to heat generated by a laser irradiation and particle can be prevented. Therefore, in the display apparatus according to the embodiment of the present disclosure, luminance deviation due to a voltage drop can be prevented, without damage of the light-emitting devices 300.

Accordingly, the display apparatus according to the embodiment of the present disclosure can include the auxiliary electrode 500 on the contact area CA of the device substrate 100, the planarization layer 150 including the auxiliary contact holes 150*t* overlapping with the contact area CA, the connection electrode 600 extending along the sidewall and the bottom surface of each auxiliary contact hole 150*t*, and the light-emitting device 300 in the emission area EA defined by the first opening 161*a* of the bank insulating layer 160, wherein the light-emitting layer 320 and the second electrode 330 of the light-emitting device 300 can extend inside of each auxiliary contact hole 150*t* through the second opening 162*a* of the bank insulating layer 160, wherein the light-emitting layer 320 on the contact area CA can expose at least portion of the connection electrode 600 on the sidewall of each auxiliary contact hole 150*t* having an inclination angle larger than that of the sidewall of the second opening 162*a* ($\theta2>\theta1$), and wherein the second electrode 330 can be in direct contact with a portion of the connection electrode 600 exposed by the light-emitting layer 320.

Thus, in the display apparatus according to the embodiment of the present disclosure, the second electrode 330 of each pixel area PA can be electrically connected to the auxiliary electrode 500 through the connection electrode 600, without irradiation of laser. Therefore, in the display apparatus according to the embodiment of the present disclosure, luminance deviation due to a voltage drop can be prevented, without damage by heat generated by irradiation of laser and particle. And, in the display apparatus according to the embodiment of the present disclosure, a process of connecting the second electrode 330 of each pixel area to the auxiliary electrode 500 can be simplified. For example, in the display apparatus according to the embodiment of the present disclosure, process efficiency can be improved.

The display apparatus according to the embodiment of the present disclosure is described that the device substrate 100 has a single-layer structure. However, in the display apparatus according to another embodiment of the present disclosure, the device substrate 100 can have a multi-layer structure. For example, in the display apparatus according to another embodiment of the present disclosure, the device substrate 100 can have a structure in which an inorganic insulating layer is disposed between two plastic substrates. Thus, in the display apparatus according to another embodiment of the present disclosure, deform of the device substrate 100 due to the external impact can be prevented.

The display apparatus according to the embodiment of the present disclosure is described that the second interlayer insulating layer 140 includes a material different from the first interlayer insulating layer 130. However, in the display apparatus according to another embodiment of the present disclosure, the second interlayer insulating layer 140 can include a same material as the first interlayer insulating layer 130. For example, a boundary between the first interlayer insulating layer 130 and the second interlayer insulating layer 140 can be not recognized. Thus, in the display apparatus according to another embodiment of the present disclosure, the degree of freedom for a configuration of the interlayer insulating layers 110, 120, 130, 140, 150 and 160 stacked on the device substrate 100 can be improved.

The display apparatus according to the embodiment of the present disclosure is described that the second electrode 330 of each pixel area PA is electrically connected to the auxiliary electrode 500, without irradiation of laser. However, in the display apparatus according to another embodiment of the present disclosure, laser can be irradiated on the contact area CA to completely remove the light-emitting layer 320 formed on the sidewall of each auxiliary contact hole 150*t*. For example, in the display apparatus according to another embodiment of the present disclosure, laser can be irradiated to increase a contact area between the second electrode 330 of each pixel area PA and the connection electrode 600. Since the light-emitting layer 320 formed on the sidewall of each auxiliary contact hole 150*t* is formed with a relatively thin thickness, time of irradiating laser can be relatively short. Thus, in the display apparatus according to the embodiment of the present disclosure, the second electrode 330 of each pixel area PA can be stably connected to the auxiliary electrode 500, and damage of the light-emitting device 300 due to irradiation of laser can be minimized.

In the display apparatus according to another embodiment of the present disclosure, the light-emitting layer 320 formed on the sidewall of each auxiliary contact hole 150*t* can be removed in various ways. For example, in the display apparatus according to another embodiment of the present disclosure, the light-emitting layer 320 formed on the sidewall of each auxiliary contact hole 150*t* can be removed using a high temperature generated by the reverse voltage.

FIGS. 5 to 8 are views sequentially showing a method of forming the display apparatus according to another embodiment of the present disclosure. FIGS. 9-12 show a display apparatus according to other variations of the present disclosure.

The method of forming the display apparatus according to another embodiment of the present disclosure will be described with reference to FIGS. 5 to 8.

Referring to FIG. 5, first, the method of forming the display apparatus according to another embodiment of the present disclosure can include a step of forming a pixel driving circuit DC including thin film transistors T2 on each pixel area PA of a device substrate 100, a step of forming an auxiliary electrode 500 on a contact area CA of the device substrate 100, a step of forming a planarization layer 150 covering the pixel driving circuit DC of each pixel area PA, a step of forming auxiliary contact holes 150*t* overlapping with the auxiliary electrode 500 in the planarization layer 150, a step of forming a first electrode 310 on the planarization layer 150 of each pixel area PA, a step of forming a connection electrode 600 extending along a sidewall and a bottom surface of each auxiliary contact hole 150*t* on the contact area CA, and a step of forming a bank insulating layer 160 including a first opening 161*a* exposing a portion of the first electrode 310 and a second opening 162*a* overlapping with the auxiliary contact holes 150*t*.

The sidewall of each auxiliary contact hole 150*t* can have an inclination angle larger than that of a sidewall of the second opening 162*a*. For example, the sidewall of each auxiliary contact hole 150*t* can be formed with an inclination angle of 60° to 90°. The second opening 162*a* can be formed simultaneously with the first opening 161*a*. A sidewall of the first opening 161*a* can be formed so that a light-emitting layer 320 formed by a subsequent process is not separated. For example, the sidewall of the first opening 161*a* can be formed with an inclination angle smaller than that of the sidewall of each auxiliary contact hole 150*t*. The sidewall of the second opening 162*a* can be formed with a same inclination angle as that of the sidewall of the first opening 161*a*.

Figures 6, 7:
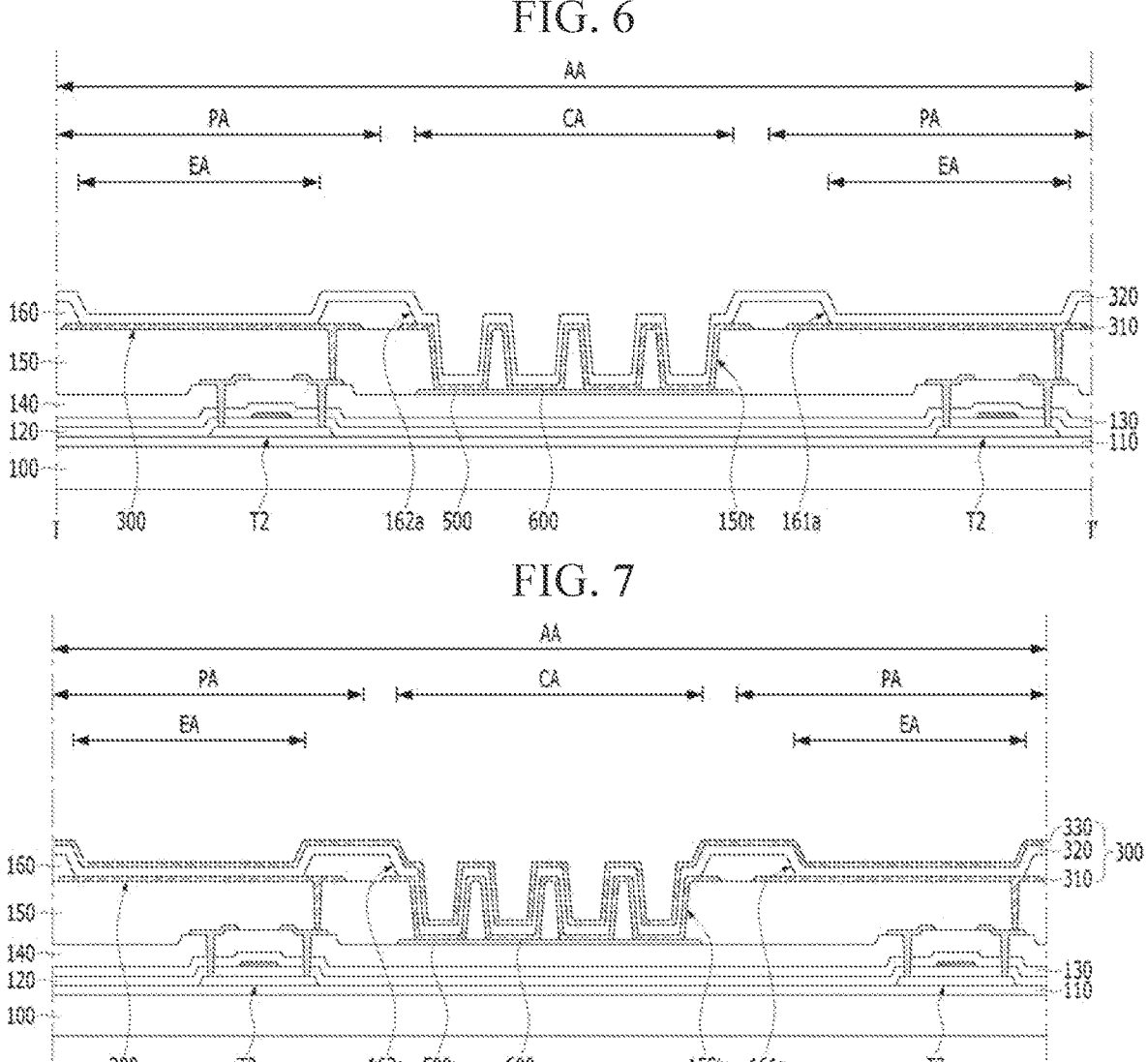

The method of forming the display apparatus according to another embodiment of the present disclosure can include a step of forming the light-emitting layer 320 on the device substrate 100 in which the first electrode 310 of each pixel area PA, the connection electrode 600 and the bank insulating layer 160 are formed, as shown in FIG. 6.

The light-emitting layer 320 can be formed to overlap the pixel areas PA and the contact area CA of the device substrate 100. For example, the step of forming the light-emitting layer 320 can include a deposition process. The light-emitting layer 320 can be formed to have a relatively thin thickness on the sidewall of each auxiliary contact hole 150*t*.

The method of forming the display apparatus according to another embodiment of the present disclosure can include a step of forming a second electrode 330 on the pixel areas PA and the contact area CA of the device substrate 100 in which the light-emitting layer 320 is formed, as shown in FIG. 7.

The second electrode 330 can be formed to extend along the light-emitting layer 320. For example, the light-emitting layer 320 and the second electrode 330 can be stacked on the sidewall and the bottom surface of each auxiliary contact hole 150*t*.

Figures 8, 9:
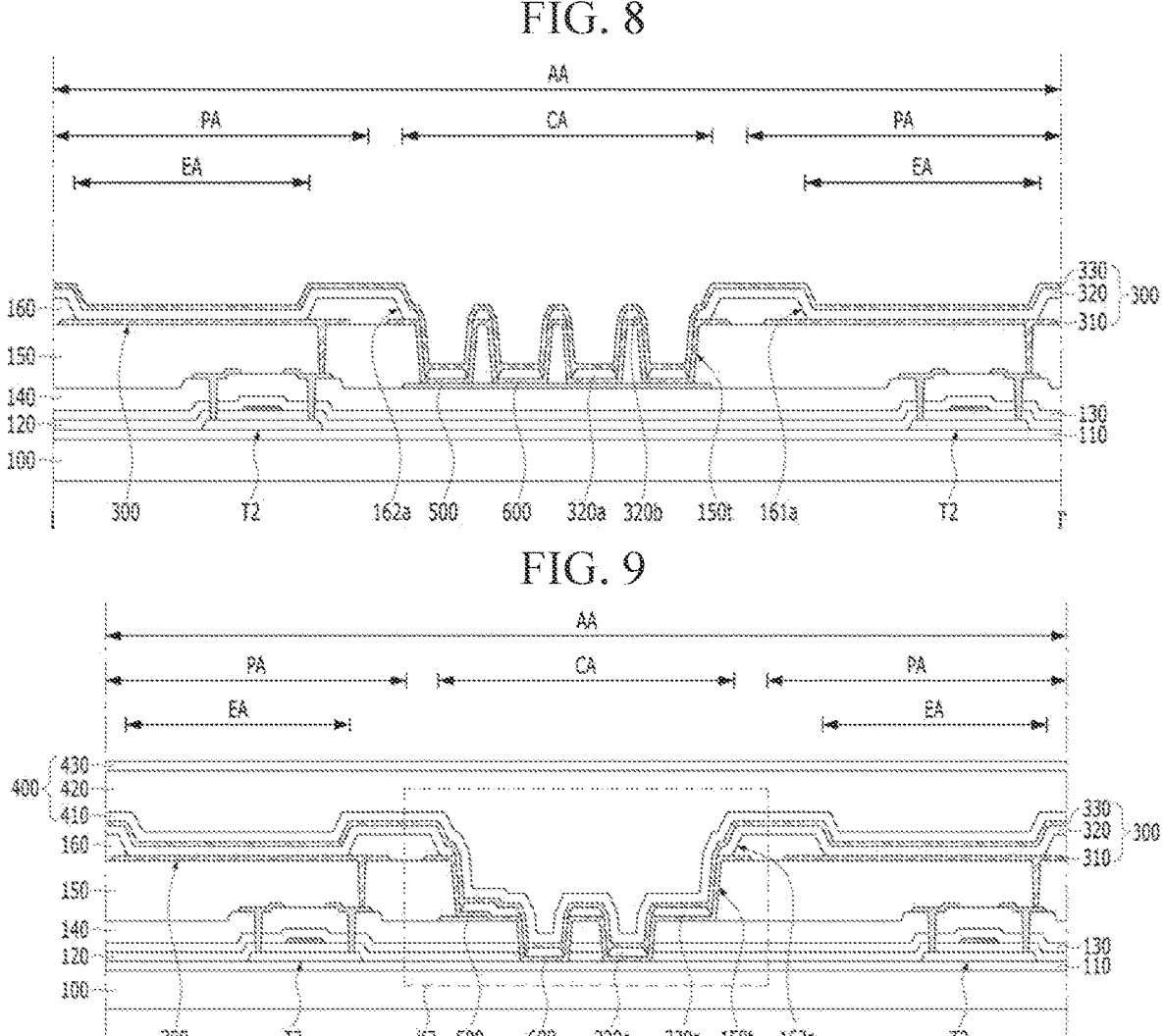

The method of forming the display apparatus according to another embodiment of the present disclosure can include a step of removing a portion of the light-emitting layer 320 on the sidewall of each auxiliary contact hole 150*t*, by applying a reverse voltage to the connection electrode 600 and the second electrode 330, as shown in FIG. 8.

A voltage can be applied to the connection electrode 600 through the auxiliary electrode 500. For example, in the method of forming the display apparatus according to another embodiment of the present disclosure, heat can be generated between the connection electrode 600 and the second electrode 330 by a voltage applied through the auxiliary electrode 500 and a voltage applied through the second electrode 330. Since a portion of the light-emitting layer 320 on the sidewall of each auxiliary contact hole 150*t* has a relative thin thickness, the light-emitting layer 320 on the sidewall of each auxiliary contact hole 150*t* can be quickly melted and removed by the heat generated between the connection electrode 600 and the second electrode 330. Thus, in the method of forming the display apparatus according to another embodiment of the present disclosure, damage of the light-emitting devices 300 can be minimized, and an area for electrical connection between the second electrode 330 of each pixel area PA and the auxiliary electrode 500 can be increased. Therefore, in the method of forming the display apparatus according to another embodiment of the present disclosure, damage of the light-emitting devices 300 can be prevented, and stability of the electrical connection between the second electrode 330 of each pixel area PA and the auxiliary electrode 500 can be improved.

Figures 10, 11:
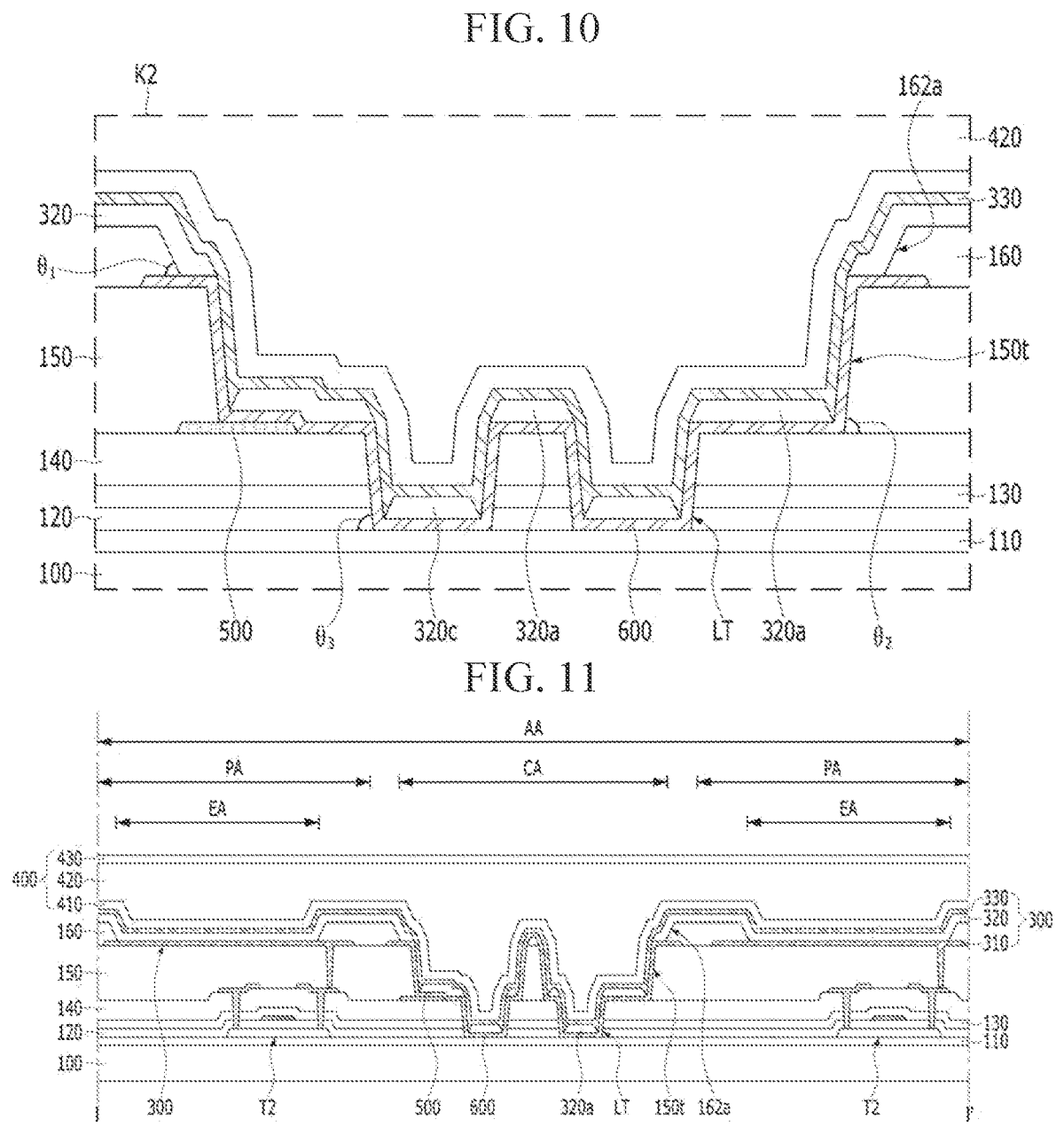

The display apparatus according to the embodiment of the present disclosure is described that the second electrode 330 of each pixel area PA is connected to the auxiliary electrode 500 through the auxiliary contact holes 150*t* formed in the planarization layer 150. However, in the display apparatus according to another embodiment of the present disclosure, at least one contact hole for electrical connection between the second electrode 330 of each pixel area PA and the auxiliary electrode 500 can be formed in various positions. For example, in the display apparatus according to another embodiment of the present disclosure, lower contact holes LT penetrates the second interlayer insulating layer 140, the auxiliary electrode 500 is disposed outside the lower contact holes LT, and the planarization layer 150 includes at least one auxiliary contact hole 150*t* overlapping with a portion of the auxiliary electrode 500 and the lower contact holes LT, as shown in FIGS. 9 and 10. FIG. 10 shows an enlarged view of region K2 of FIG. 9. A width 500*w* of the auxiliary electrode 500 can be smaller than a width Wc of the contact area CA. For example, the auxiliary electrode 500 can include a first end disposed between the second interlayer insulating layer 140 and the planarization layer 150 and a second end exposed by the auxiliary contact hole 150*t*.

The connection electrode 600 can extend along a sidewall and a bottom surface of each lower contact hole LT. The light-emitting layer 320 and the second electrode 330 of each pixel area PA can extend inside of each lower contact hole LT. The second interlayer insulating layer 140 can be an inorganic insulating layer. A sidewall of hole disposed in the inorganic insulating layer can be formed to have a larger inclination angle than that of a sidewall of a hole disposed in an organic insulating layer. For example, an inclination angle θ3 of the sidewall of each lower contact hole LT can be larger than an inclination angle θ2 of a sidewall of the auxiliary contact hole 150*t*. Thus, in the display apparatus according to another embodiment of the present disclosure, the light-emitting layer 320 of the contact area CA can expose at least portion of the connection electrode 600 on the sidewall of each lower contact hole LT. For example, a third light-emitting pattern 320*c* on the bottom surface of each lower contact hole LT can be spaced apart from a first light-emitting pattern 320*a* on a bottom surface of the auxiliary contact hole 150*t*. For example, in the display apparatus according to another embodiment of the present disclosure, the second electrode 330 of each pixel area PA can be in direct contact with at least portion of the connection electrode 600 on the sidewall of each lower contact hole LT. Therefore, in the display apparatus according to another embodiment of the present disclosure, stability of electrical connection between the second electrode 330 of each pixel area PA and the auxiliary electrode 500 can be effectively improved.

Each of the lower contact holes LT can completely penetrate the second interlayer insulating layer 140. For example, each of the lower contact holes LT can penetrate the gate insulating layer 120 and the first interlayer insulating layer 130. Thus, in the display apparatus according to another embodiment of the present disclosure, an area of the sidewall of each lower contact hole LT can be increased. For example, in the display apparatus according to another embodiment of the present disclosure, a contact area between the second electrode 330 of each pixel area PA and the connection electrode 600 in each lower contact hole LT can be increased. Therefore, in the display apparatus according to another embodiment of the present disclosure, stability of electrical connection between the second electrode 330 of each pixel area PA and the auxiliary electrode 500 can be improved, without damage of the light-emitting devices 300.

The display apparatus according to another embodiment of the present disclosure can include lower contact holes LT penetrating the second interlayer insulating layer 140 and auxiliary contact holes 150t penetrating the planarization layer 150, as shown in FIG. 11. Each of the lower contact holes LT can overlap one of the auxiliary contact holes 150t. Thus, in the display apparatus according to another embodiment of the present disclosure, a contact area between the second electrode 330 of each pixel area PA and the connection electrode 600 can be effectively increased.

Figure 12:
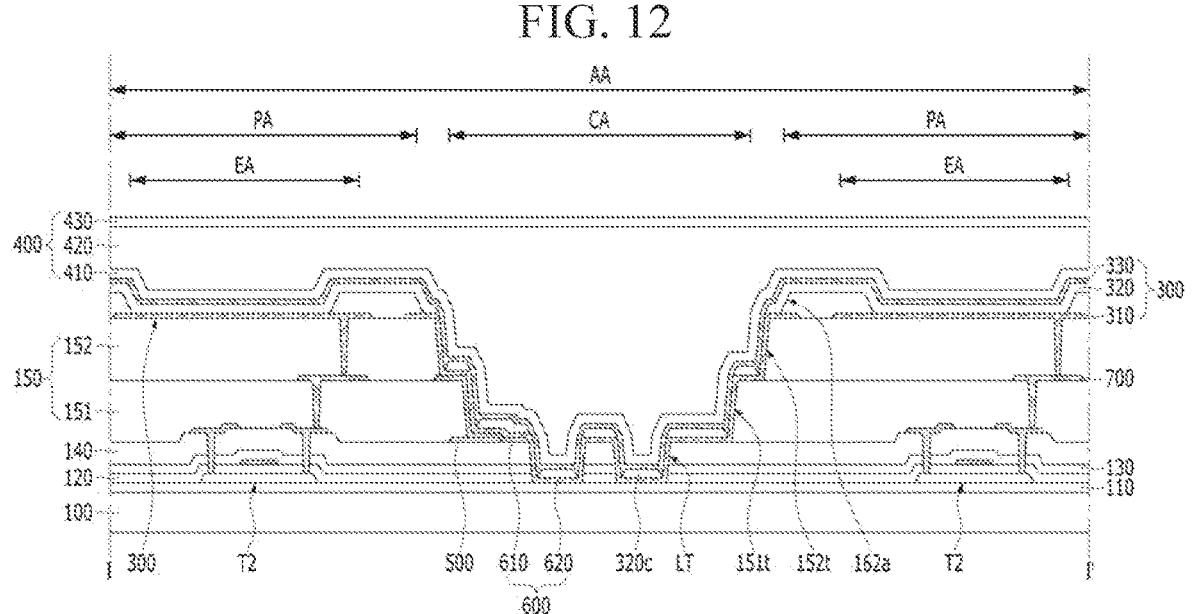

The display apparatus according to the embodiment of the present disclosure is described that the planarization layer 150 has a single-layer structure. However, in the display apparatus according to another embodiment of the present disclosure, the planarization layer 150 can have a multi-layer structure. For example, in the display apparatus according to another embodiment of the present disclosure, the planarization layer 150 can have a stacked structure of a first planarization layer 151 and a second planarization layer 152, as shown in FIG. 12. The first planarization layer 151 and the second planarization layer 152 can include an organic insulating material. The second planarization layer 152 can include a material different from the first planarization layer 151. Thus, in the display apparatus according to another embodiment of the present disclosure, luminance deviation according to generating position of light emitted from each light-emitting device 300 can be effectively prevented.

An intermediate electrode 700 can be disposed between the first planarization layer 151 and the second planarization layer 152 of each pixel area PA. The intermediate electrode 700 of each pixel area PA can be electrically connected to the pixel driving circuit and the light-emitting device 300 of the corresponding pixel area PA. For example, the first electrode 310 of each pixel area PA can be electrically connected to the second source electrode 227 of the corresponding pixel area PA through the intermediate electrode 700 of the corresponding pixel area PA. The intermediate electrode 700 can include a conductive material. For example, the intermediate electrode 700 can include a metal, such as aluminum (Al), chrome (Cr), copper (Cu), molybdenum (Mo), titanium (Ti) and tungsten (W).

The first planarization layer 151 can include a first auxiliary contact hole 151t overlapping with the contact area CA. The first auxiliary contact hole 151t can expose a portion of the auxiliary electrode 500. The lower contact holes LT can overlap the first auxiliary contact hole 151t. The second planarization layer 152 can include a second auxiliary contact hole 152t overlapping with the contact area CA. The second auxiliary contact hole 152t can overlap the first auxiliary contact hole 151t. A width of the second auxiliary contact hole 152t can be larger than a width of the first auxiliary contact hole 151t. For example, the lower contact holes LT can be disposed in the second auxiliary contact hole 152t. The second opening 162a of the bank insulating layer 160 can have a width larger than the second auxiliary contact hole 152t. For example, the second auxiliary contact hole 152t can overlap the second opening 162a.

A sidewall of the first auxiliary contact hole 151t, a sidewall of the second auxiliary contact hole 152t and a sidewall of each lower contact hole LT can have an inclination angle larger than that of a sidewall of the second opening 162a. An inclination angle of the sidewall of the first auxiliary contact hole 151t, an inclination angle of the sidewall of the second auxiliary contact hole 152t and an inclination angle of the sidewall of each lower contact hole LT can sequentially increase. For example, the sidewall of the first auxiliary contact hole 151t can have an inclination angle larger than that of the sidewall of the second opening 162a, the sidewall of the second auxiliary contact hole 152t can have an inclination angle larger than that of the sidewall of the first auxiliary contact hole 151t, and the sidewall of each lower contact hole LT can have an inclination angle larger than that of the sidewall of the second auxiliary contact hole 152t. Thus, in the display apparatus according to another embodiment of the present disclosure, the second electrode 330 of each pixel area PA can be stably connected to the connection electrode 600. Therefore, in the display apparatus according to another embodiment of the present disclosure, luminance deviation due to voltage drop can be effectively prevented, without irradiation of laser.

The connection electrode 600 can have a multi-layer structure. For example, the connection electrode 600 can have a stacked structure of a lower connection electrode 610 and an upper connection electrode 620. An end of the lower connection electrode 610 can be disposed between the first planarization layer 151 and the second planarization layer 152. For example, the lower connection electrode 610 can include a same material as the intermediate electrode 700. A sidewall of the first planarization layer 151 can be in direct contact with the lower connection electrode 610. An end of the upper connection electrode 620 can be disposed between the second planarization layer 152 and the bank insulating layer 160. For example, the upper connection electrode 620 can extend along the sidewall of the first planarization layer 151 and the sidewall of the second planarization layer 152.

The lower connection electrode 610 can be in direct contact with the auxiliary electrode 500. The upper connection electrode 620 can be in direct contact with the lower connection electrode 610. For example, the upper connection electrode 620 can be electrically connected to the auxiliary electrode 500 through the lower connection electrode 610. The lower connection electrode 610 can be disposed outside the lower contact holes LT. For example, the sidewall and the bottom surface of each lower contact hole LT can be covered by the upper connection electrode 620. Thus, in the display apparatus according to the embodiment of the present disclosure, an contact area between the second electrode 330 of each pixel area PA and the connection electrode 600 can be increased, and stability of electrical connection between the second electrode 330 of each pixel area PA and the auxiliary electrode 500 can be improved. Therefore, in the display apparatus according to another embodiment of the present disclosure, luminance deviation due to voltage drop can be effectively prevented or minimized, without damage of the light-emitting devices 300.

As a result, the display apparatus according to the embodiments of the present disclosure can comprise the light-emitting device on the pixel area, the auxiliary electrode on the contact area adjacent to the pixel area, the insulating layer including at least one contact hole overlapping with the contact area, and the connection electrode electrically connected to the auxiliary electrode, wherein the light-emitting layer and the second electrode of the light-emitting device and the connection electrode can extend inside the contact hole, wherein the sidewall of the contact hole can have a relatively large inclination angle, and wherein the second electrode can be electrically connected to the connection electrode on the sidewall of the contact hole. For example, in the display apparatus according to the embodiments of the present disclosure, the second electrode can be electrically connected to the auxiliary electrode through the connection electrode.

Thus, in the display apparatus according to the embodiments of the present disclosure, time of irradiating laser to electrically connect the second electrode of the light-emitting device and the auxiliary electrode can be minimized. Thereby, in the display apparatus according to the embodiments of the present disclosure, the damage of the light-emitting device due to a process of connecting the second electrode of the light-emitting device to the auxiliary electrode can be prevented or minimized. Further, in the display apparatus according to the embodiments of the present disclosure, power consumption needed for operation of each pixel region can be reduced, and low-power driving can be realized.

What is claimed is:

1. A display apparatus comprising:
    a device substrate including an emission area and a contact area;
    an auxiliary electrode on the contact area of the device substrate;
    a first insulating layer on the device substrate, the first insulating layer including at least one first contact hole overlapping with the contact area;
    a connection electrode electrically connected to the auxiliary electrode, the connection electrode extending along a sidewall and a bottom surface of the at least one first contact hole;
    a bank insulating layer on the first insulating layer, the bank insulating layer including a first opening overlapping with the emission area and a second opening exposing at least portion of the connection electrode; and
    a light-emitting device on the first insulating layer exposed by the first opening, the light-emitting device including a stacked structure having a first electrode, a light-emitting layer and a second electrode,
    wherein the light-emitting layer and the second electrode of the light-emitting device extend inside of the at least one first contact hole through the second opening,
    wherein the sidewall of the at least one first contact hole has an inclination angle larger than an inclination angle of a sidewall of the second opening, and
    wherein the second electrode is in contact with the connection electrode on the sidewall of the at least one first contact hole.

2. The display apparatus according to claim 1, wherein the difference between the inclination angle of the sidewall of the first contact hole and a right angle is smaller than the difference between the inclination angle of the sidewall of the second opening and a right angle.

3. The display apparatus according to claim 1, wherein the sidewall of the second opening has an inclination angle that is same as a sidewall of the first opening.

4. The display apparatus according to claim 1, wherein the at least one first contact hole overlaps a portion of the auxiliary electrode, and
    wherein the connection electrode is in contact with the auxiliary electrode in the at least one first contact hole.

5. The display apparatus according to claim 4, wherein a width of the auxiliary electrode is smaller than a width of the contact area.

6. The display apparatus according to claim 4, further comprising a second insulating layer between the device substrate and the first insulating layer,
    wherein the second insulating layer includes at least one second contact hole overlapping with the contact area, wherein the connection electrode, the light-emitting layer and the second electrode extend inside of the at least one second contact hole, and
    wherein a sidewall of the at least one second contact hole has an inclination angle larger than the inclination angle of the sidewall of the at least one first contact hole.

7. The display apparatus according to claim 6, wherein the second electrode is in contact with the connection electrode on the sidewall of the at least one second contact hole.

8. The display apparatus according to claim 6, wherein the at least one second contact hole is disposed outside the auxiliary electrode.

9. The display apparatus according to claim 8, wherein the at least one second contact hole overlaps the at least one first contact hole.

10. The display apparatus according to claim 6, wherein the second insulating layer includes a material different from a material of the first insulating layer.

11. The display apparatus according to claim 10, wherein the first insulating layer includes an organic insulating material, and the second insulating layer includes an inorganic insulating material.

12. A display apparatus comprising:
    an interlayer insulating layer on a device substrate, the interlayer insulating layer including at least one lower contact hole;
    an auxiliary electrode on the interlayer insulating layer, the auxiliary electrode spaced apart from the at least one lower contact hole;
    an upper planarization layer on the interlayer insulating layer, the upper planarization layer including an upper contact hole overlapping with a portion of the auxiliary electrode and the at least one lower contact hole;
    an upper connection electrode electrically connected to the auxiliary electrode in the upper contact hole, the upper connection electrode extending along a sidewall and a bottom surface of the upper contact hole;
    a first electrode on the upper planarization layer, the first electrode being spaced apart from the upper connection electrode;
    a bank insulating layer on the upper planarization layer, the bank insulating layer including a first opening exposing a portion of the first electrode and a second opening overlapping with the upper contact hole;
    a light-emitting layer on the portion of the first electrode exposed by the first opening, the light-emitting layer extending inside of the at least one lower contact hole through the upper contact hole; and
    a second electrode on the light-emitting layer, the second electrode overlapping with the first electrode and the upper connection electrode,
    wherein the sidewall of the at least one lower contact hole has an inclination angle larger than an inclination angle of a sidewall of the second opening,
    wherein the light-emitting layer exposes at least portion of the upper connection electrode on the sidewall of the at least one lower contact hole, and
    wherein the second electrode is electrically connected to a portion of the upper connection electrode exposed by the light-emitting layer.

13. The display apparatus according to claim 12, wherein a sidewall of the upper contact hole has an inclination angle larger than the inclination angle of the sidewall of the second opening.

14. The display apparatus according to claim 12, further comprising:

a lower planarization layer between the interlayer insulating layer and the upper planarization layer, the lower planarization layer including an intermediate contact hole overlapping with a portion of the auxiliary electrode and the at least one lower contact hole in the upper contact hole; and a lower connection electrode electrically connected to the upper connection electrode, the lower connection electrode being in contact with the auxiliary electrode in the intermediate contact hole.

15. The display apparatus according to claim 14, wherein a sidewall of the intermediate contact hole has an inclination angle larger than the inclination angle of the sidewall of the second opening.

16. The display apparatus according to claim 12, wherein the upper connection electrode includes a same material as the first electrode.

\* \* \* \* \*